United States Patent
Shen et al.

(10) Patent No.: US 11,502,657 B2
(45) Date of Patent: Nov. 15, 2022

(54) CLOCK DRIVE CIRCUIT

(71) Applicant: NO. 24 RESEARCH INSTITUTE OF CHINA ELECTRONICS TECHNOLOGY GROUP CORPORATION, Chongqing (CN)

(72) Inventors: Xiaofeng Shen, Chongqing (CN); Xingfa Huang, Chongqing (CN); Liang Li, Chongqing (CN); Xi Chen, Chongqing (CN); Mingyuan Xu, Chongqing (CN); Jian'an Wang, Chongqing (CN); Dongbing Fu, Chongqing (CN); Guangbing Chen, Chongqing (CN)

(73) Assignee: NO. 24 RESEARCH INSTITUTE OF CHINA ELECTRONICS TECHNOLOGY GROUP CORPORATION, Chongqing (CN)

(*) Notice: Subject to any disclaimer, the term of this patent is extended or adjusted under 35 U.S.C. 154(b) by 0 days.

(21) Appl. No.: 17/040,516

(22) PCT Filed: Jul. 25, 2018

(86) PCT No.: PCT/CN2018/096977
§ 371 (c)(1),
(2) Date: Sep. 22, 2020

(87) PCT Pub. No.: WO2020/019184
PCT Pub. Date: Jan. 30, 2020

(65) Prior Publication Data
US 2021/0135641 A1    May 6, 2021

(30) Foreign Application Priority Data

Jul. 23, 2018 (CN) .......................... 201810810576.2

(51) Int. Cl.
H03F 3/45 (2006.01)
H03F 3/68 (2006.01)
(Continued)

(52) U.S. Cl.
CPC ..... *H03F 3/45269* (2013.01); *H03F 3/45636* (2013.01); *H03F 3/68* (2013.01); *H03K 3/012* (2013.01); *H03K 3/013* (2013.01)

(58) Field of Classification Search
CPC ...... H03F 3/45269; H03F 3/68; H03F 3/3022; H03F 3/45237; H03F 3/45636;
(Continued)

(56) References Cited

U.S. PATENT DOCUMENTS

2021/0013851 A1* 1/2021 Dabrowski ......... H03F 3/45206

* cited by examiner

*Primary Examiner* — Jung Kim

(57) ABSTRACT

A clock driver circuit, including: an input stage, a double-ended to single-ended conversion stage and a driver output stage connected in sequence. The input stage includes two mutually loaded differential amplifiers and a common mode negative feedback loop. The differential amplifiers are connected to a differential clock signal for amplification to generate a common mode voltage. The common mode feedback circuit is connected to an output end of the differential amplifiers to stabilize the output amplitude of the common mode voltage. The double-ended to single-ended conversion stage converts a differential sine clock signal output by the double-ended common mode voltage into a single-ended square wave clock signal. The driver output stage includes a multi-stage cascaded push-pull phase inverter to improve the drive capability of the square wave clock signal.

9 Claims, 2 Drawing Sheets

(51) Int. Cl.
*H03K 3/012* (2006.01)
*H03K 3/013* (2006.01)

(58) Field of Classification Search
CPC ............... H03F 3/4565; H03F 3/45183; H03F 3/45179; H03F 3/45076; H03F 3/3001; H03F 3/3032; H03F 3/45632; H03K 3/012; H03K 3/013
See application file for complete search history.

CLOCK DRIVE CIRCUIT

CROSS REFERENCES TO RELATED APPLICATIONS

This is a Sect. 371 National Stage application of a PCT International Application No. PCT/CN2018/096977, filed on Jul. 25, 2018, which claims priority of a Chinese Patent Applications No. 2018108105762, filed on Jul. 23, 2018, the content of which is hereby incorporated by reference in its entirety for all purposes.

TECHNICAL FIELD

The present disclosure relates to the technical field of integrated circuits, in particular, to a clock driver circuit with low jitter and high speed, which can be applied to data converters with high requirements for clock circuits in integrated circuits.

BACKGROUND

With the development of high-speed and high-precision converters, A/D converters that can achieve direct high-frequency sampling have increasingly higher requirements for the performance of clocks. Jitter is the most important parameter in the design of clock driver circuits. Clock jitter is defined as a short-term change in the clock signal that deviates from the ideal time position at a threshold level at which the logic state changes. In high-speed A/D converters, timing errors caused by clock jitter tend to limit the maximum transmission rate of digital I/O interfaces, increase the bit error rate of the signal path, and limit the dynamic range of the analog-to-digital converter. Clock jitter would also reduce the signal-to-noise ratio of the A/D converters, which directly affects the accuracy of the A/D converters.

The noise that affects the clock jitter mainly comes from the noise of the off-chip input clock signal and the noise of the on-chip clock driver circuit. For off-chip noise, currently, an ultra-low jitter external clock source can be obtained by using a low-noise analog signal source or crystal oscillator and narrow-band filtering. The on-chip clock driver circuit is a common circuit structure, which can convert a differential sine clock signal into a single-ended square wave clock signal, reduce clock jitter and increase the drive capability, and then be provided to other units on the chip. The noise of the on-chip clock driver circuit is mainly introduced by the circuit devices and the excessively slow clock slope.

For a conventional clock driver circuit, as shown in FIG. 1, VDD is the voltage source of the clock driver circuit, GND is the circuit ground, Ckin+ and Ckin− are the differential clock input signals of the circuit, Vbias1 and Vbias2 are the gate voltages of the tail current source of the input stage and the second stage, respectively, and Ckout is the clock output signal of the circuit.

The conventional clock driver circuit 100 includes a differential input stage 101, a second stage 102, and a driver output stage 103. The differential input stage 101 acting as the first stage of the circuit consists of NMOS transistors M1, M2, M3, capacitors C1, C2, and resistors R1, R2. The second stage 102 consists of NMOS transistors M4, M5, M6, and PMOS transistors M7, M8. The driver output stage 103 consists of NMOS transistors M9, M11, and PMOS transistors M10, M12.

The off-chip differential input clock signal first passes through the first stage 101 of the clock driver circuit. The differential input pair in 101 can effectively suppress the common mode noise interference of the off-chip clock. Then, a double-ended to single-ended processing is performed by the second stage 102, and the sine wave signal is converted into a square wave signal. Finally, the square wave output signal of the second stage is output through the driver output stage 103 composed of two cascaded push-pull phase inverters. The square wave clock signal output by the driver output stage can drive a large capacitive load.

The input stage of the circuit uses a differential pair structure. At the sampling point, the input pair transistors in the differential amplifiers are in the saturation region. The noise from the tail current source transistor M1 is canceled by the well-matched input pair transistors. The noise from the power supply and ground is also canceled. Therefore, the noise output by the first stage 101 is mainly contributed by the input pair transistors M2, M3 and the load resistors R2, R3. The clock jitter expression for a single-stage differential amplifiers is:

$$\sigma_{jitter}^2 = \frac{V_{n,o}^2}{(A_{in}\omega A_V)^2} = \frac{kT}{(A_{in}\omega)^2 A_V C}\left[\lambda + \frac{2}{A_V}\right] \quad (1)$$

Ain is the amplitude of the input signal, ω is the angular frequency of the input signal, $A_v$ is the gain of the differential input end, $V_{n,o}^2$ is the total output noise voltage, k is the Kelvin coefficient, T is the absolute temperature, and λ is the noise coefficient.

The second stage 102 converts the differential sine clock signal into a single-ended square wave clock signal. The edge slope of the single-end-output square wave clock signal cannot be 1, and the smaller the slope, the greater the clock jitter would be introduced.

According to the above analysis, the disadvantage of the conventional clock driver circuit 100 is that in order to reduce the clock jitter, it is necessary to increase the gain of the first stage differential amplifier, and increase the tail current of the second stage or size of the transistor, which may cause problems such as increased power consumption and excessive load capacitance.

SUMMARY

The present disclosure provides a clock driver circuit for solving the problem that the power supply and the scale of the driver circuit need to be increased when the clock jitter is reduced.

The present disclosure provides a clock driver circuit, including: an input stage, a double-ended to single-ended conversion stage and a driver output stage connected in sequence.

The input stage includes two mutually loaded differential amplifiers and a common mode negative feedback loop. The differential amplifiers are connected to a differential clock signal for amplification to generate a common mode voltage. The common mode negative feedback loop is connected to an output end of the differential amplifiers to stabilize the output amplitude of the common mode voltage.

The double-ended to single-ended conversion stage converts a differential sine clock signal output by the double-ended common mode voltage into a single-ended square wave clock signal.

The driver output stage includes a multi-stage cascaded push-pull phase inverter to improve the drive capability of the square wave clock signal.

Preferably, the mutually loaded differential amplifiers include NMOS transistors M5 and M6, PMOS transistors M7 and M8. The positive input signal Ckin+ is connected to the gates of the NMOS transistor M5 and PMOS transistor M7, respectively. The drains of the NMOS transistor M5 and the PMOS transistor M7 are interconnected. The negative input signal Ckin- is connected to the gates of the NMOS transistor M6 and PMOS transistor M8. The sources of the PMOS transistors M7 and M8 are interconnected, the sources of the NMOS transistors M5 and M6 are interconnected, and the drains of the NMOS transistor M6 and the PMOS transistor M8 are interconnected.

Preferably, the common mode negative feedback loop includes an amplitude suppression circuit, resistors R4 and R5, and an NMOS transistor M4. The amplitude suppression circuit includes NMOS transistors M1 to M3, resistors R1 to R3. One end of the first resistor R1 is grounded, and the other end of the first resistor R1 is connected to the source of the NMOS transistor M1. The gate and drain of the NMOS transistor M1 are interconnected and are respectively interconnected with the gate of M2 and the source of M3. The drain and gate of the NMOS transistor M3 are interconnected and are connected to one end of the third resistor, and the other end of the third resistor is connected to a power supply voltage. The source of the NMOS transistor M2 is connected to one end of the second resistor R2, and the other end of the second resistor R2 is grounded. The drain of the NMOS transistor M2 is connected to one ends of the fourth resistor and fifth resistor, and is connected to the gate of the NMOS transistor M4. The source of the NMOS transistor M4 is connected to ground, and the other ends of the fourth resistor and fifth resistor are correspondingly connected to the common mode voltage output by the differential amplifier.

Preferably, the input stage includes an NMOS transistor M9, a source of the NMOS transistor M9 is connected to a power supply voltage, a gate of the NMOS transistor M9 is connected to a first bias voltage, and a drain of the NMOS transistor M9 is connected to the sources of the PMOS transistors M7 and M8 of the differential amplifier.

Preferably, the double-ended to single-ended conversion stage includes a double-ended to single-ended conversion circuit and a branch circuit. The double-ended to single-ended conversion circuit converts a differential sine clock signal into a single-ended square wave clock signal. The branch circuit adjusts a clock edge slope to reduce the clock jitter when converting the clock signal.

Preferably, the double-ended to single-ended conversion circuit includes NMOS transistors M10 to M12, and PMOS transistors M15 to M16. The gate of the NMOS transistor M10 is connected to a second bias voltage, the source of the NMOS transistor M10 is grounded, and the drain of the NMOS transistor M10 is respectively connected to the sources of the NMOS transistors M11 and M12. The gates of the NMOS transistors M11 and M12 are correspondingly connected to the output end of the differential amplifier, and the drains of the NMOS transistors M11 and M12 are connected to the drains of the PMOS transistors M15 and M16. The sources of the PMOS transistors M15 and M16 are connected to the power supply voltage, and the gates of the PMOS transistors M15 and M16 are interconnected and connected to the drain of the PMOS transistor M15.

Preferably, the branch circuit includes NMOS transistors M13 to M14. The gate of the NMOS transistor M13 is connected to the gate of the NMOS transistor M16. The drain of the NMOS transistor M13 is connected to the source of the NMOS transistor M12. The source of the NMOS transistor M13 is connected to the drain of the NMOS transistor M14. The source of the NMOS transistor M14 is grounded, and the gate of the NMOS transistor M14 is connected to the enable signal.

Preferably, the multi-stage cascaded push-pull phase inverter includes a two-stage push-pull phase inverter.

Preferably, the two-stage push-pull phase inverter includes a first-stage push-pull phase inverter and a second-stage push-pull phase inverter sequentially cascaded. The first-stage push-pull phase inverter includes an NMOS transistor M17 and PMOS transistor M19. The second-stage push-pull phase inverter includes an NMOS transistor M18 and a PMOS transistor M20. The gate of the NMOS transistor M17 and the gate of M19 are interconnected to access the output end of the double-ended to single-ended conversion stage. The sources of the PMOS transistors M19 and M20 are connected to the power supply voltage. The sources of the NMOS transistors M17 and M18 are grounded. The drains of the NMOS transistor M17 and the PMOS transistor M19 are interconnected and connected to the gates of the NMOS transistor M18 and the PMOS transistor M20. The drains of the NMOS transistor M18 and the PMOS transistor M20 are interconnected as an output.

As described above, the clock driver circuit of the present disclosure has the following beneficial effects:

The input stage of the present disclosure uses differential amplifiers which load each other, either of the two differential amplifiers serves as the load of the other one to expand the amplitude range of the input stage, a large-current sinking and supplying capability is provided, and the slew rate is improved, such that the clock driver circuit can receive large-amplitude and high-speed input clock signals.

At the same time, a branch is provided in the double-ended to single-ended conversion circuit. During the double-ended to single-ended conversion process of the clock signal, the branch increases the current during conversion according to the signal, which may increase the slope of the clock edge and effectively reduce the clock jitter.

DETAILED DESCRIPTION OF THE PREFERRED EMBODIMENTS

The embodiments of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure. It needs to be stated that the following embodiments and the features in the embodiments can be combined with one another under the situation of no conflict.

It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be freely changed, and the component layout configuration thereof may be more complex.

Figure 1:
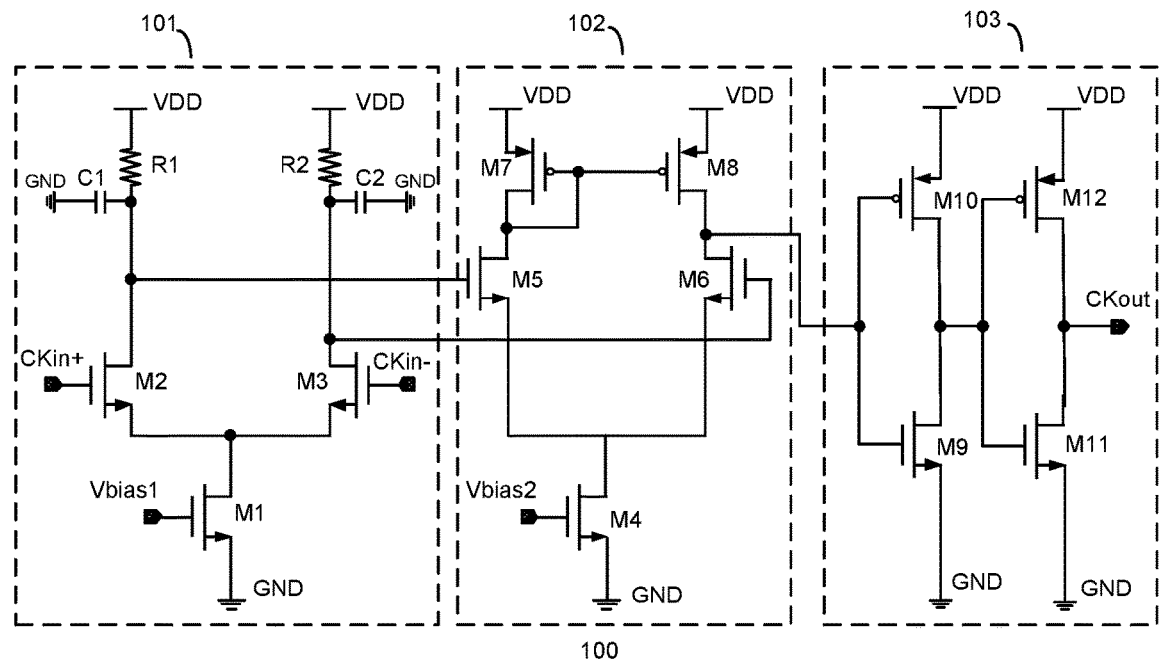
FIG. 1 shows a circuit diagram of a conventional clock driver circuit according to the present disclosure.
Figure 2:
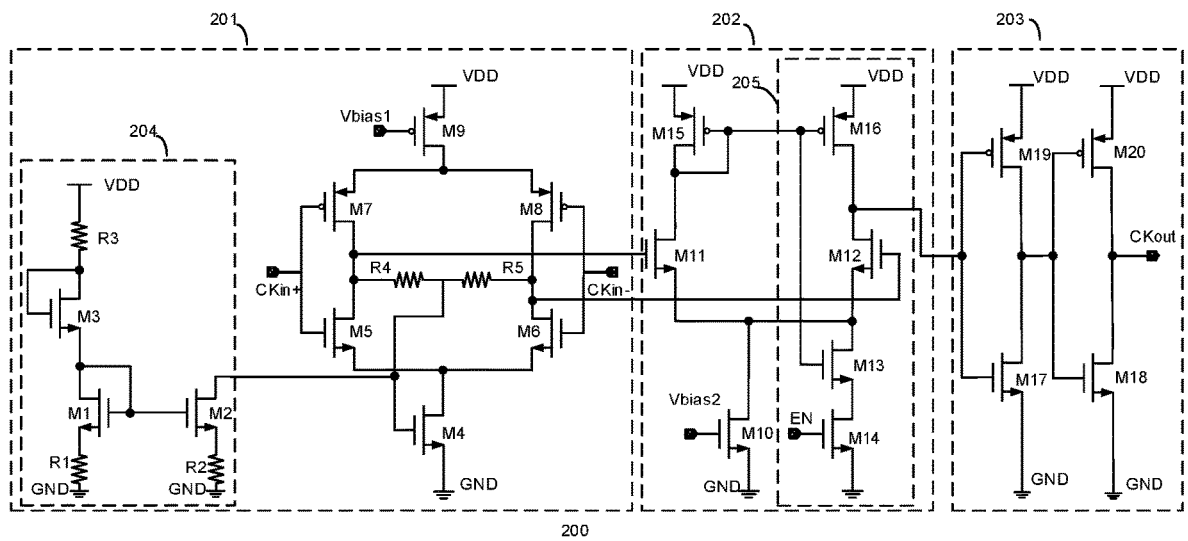
FIG. 2 shows a circuit diagram of a clock driver circuit according to the present disclosure.

Referring to FIG. 2 for a circuit diagram of a clock driver circuit of the present disclosure. The clock driver circuit includes an input stage, a double-ended to single-ended conversion stage and a driver output stage connected in sequence.

The input stage includes two mutually loaded differential amplifiers and a common mode negative feedback loop. The differential amplifiers are connected to a differential clock signal for amplification to generate a common mode voltage. The common mode negative feedback loop is connected to an output end of the differential amplifiers to stabilize the output amplitude of the common mode voltage. The input stage includes: NMOS transistors M1 to M6, PMOS transistors M7 to M9, and resistors R1 to R5.

The source of the NMOS transistor M1 is connected to one end of the first resistor R1, and the other end of the first resistor R1 is grounded to GND. The gate of the NMOS transistor M1 is connected to the drain of the NMOS transistor M1. The gate and drain of the NMOS transistor M1 are connected to the gate of the NMOS transistor M2 and the source of the M3.

The gate of the NMOS transistor M3 is connected to the drain of the NMOS transistor M3. The gate and drain of the NMOS transistor M3 are connected to one end of the third resistor R3, and the other end of the third resistor R3 is connected to the power source VDD.

The source of the NMOS transistor M2 is connected to one end of the second resistor R2, and the other end of the second resistor R2 is grounded to GND. The drain of the NMOS transistor M2 is connected to the gate of the NMOS transistor M4.

The fourth resistor R4 is connected in series with the fifth resistor R5, the series node is connected to the gate of the NMOS transistor M4. The source of the NMOS transistor M4 is grounded, and the drain of the NMOS transistor M4 is connected to the sources of the NMOS transistors M5 and M6, respectively.

The gate of the NMOS transistor M5 is connected to the gate of the PMOS transistor M7, and the gates of the NMOS transistor M5 and PMOS transistor M7 are connected to the positive input end Ckin+. The gate of the NMOS transistor M6 is connected to the gate of the PMOS transistor M8, and the gates of the NMOS transistor M6 and PMOS transistor M8 are connected to the negative input end Ckin−. The source of the PMOS transistor M7 is connected to the source of the PMOS transistor M8, the sources of the PMOS transistor M7 and the PMOS transistor M8 are connected to the drain of the PMOS transistor M9.

The source of the PMOS transistor M9 is connected to the power supply VDD, the gate of the PMOS transistor M9 is connected to a bias voltage Vbias1. The drain of the NMOS transistor M5 is connected to the drain of the PMOS transistors M7, the drains of the NMOS transistor M5 and the PMOS transistors M7 are connected to the other end of the fourth resistor R4. The drain of the NMOS transistor M6 is connected to the drain of the PMOS transistors M8, the drains of the NMOS transistor M6 and the PMOS transistors M8 are connected to the other end of the fifth resistor R5.

The double-ended to single-ended conversion stage converts a differential sine clock signal output by the double-ended common mode voltage into a single-ended square wave clock signal. The double-ended to single-ended conversion stage includes:

NMOS transistors M10 to M14 and PMOS transistors M15 to M16. The gate of the NMOS transistor M10 is connected to a bias voltage Vbias2, the source of the NMOS transistor M10 is grounded to GND. The gate of the NMOS transistor M11 is connected to the drain of the M5. The drain of the PMOS transistor M15 is connected to the gate of M15, and the drain and the gate of M15 are together connected to the drain of the NMOS transistor M11 and the gate of the PMOS transistor M16. The source of the PMOS transistor M15 is connected to the power source VDD, and the source of the PMOS transistor M16 is connected to the power source VDD. The drain of the PMOS transistor M16 is connected to the drain of the NMOS transistor M12. The source of the NMOS transistor M12 is connected to the source of M11, and the sources of M12 and M11 are together connected to the drains of M10 and M13. The gate of the NMOS transistor M12 is connected to the drain of NMOS transistor M6. The gate of NMOS transistor M13 is connected to the gate of the M16. The source of the M13 is connected to the drain of the M14. The gate of the M14 is connected to the enable signal EN, and the source of M14 is grounded to GND.

The driver output stage includes a multi-stage cascaded push-pull phase inverter to improve the driver capability of the square wave clock signal. The driver output stage includes:

NMOS transistors M17 to M18, and PMOS transistors M19 to M20. The gate of the NMOS transistor M17 is connected to the gate of the PMOS transistor M19, and the gates of M17 and M19 are connected to the drain of the NMOS transistor M12. The source of the NMOS transistor M17 is grounded to GND, and the source of the PMOS transistor M19 is connected to the power source VDD. The drain of NMOS transistor M17 is connected to the drain of M19, and the drains of M17 and M19 are connected to the gates of M18 and M20. The source of the NMOS transistor M18 is grounded to GND. The source of the PMOS transistor M20 is connected to the power source VDD. The drain of the NMOS transistor M18 is connected to the drain of M20, and the drains of M18 and M20 are together connected to the output end CKout.

An input stage 201, a double-ended to single-ended conversion stage 202 and a driver output stage 203. VDD is the voltage source of the clock driver circuit, GND is the circuit ground, Ckin+ and Ckin− are the differential clock input signals of the circuit, Vbias1 and Vbias2 are the gate voltages of the current source of the input stage and the double-ended to single-ended conversion stage, respectively, and Ckout is the clock output signal of the circuit.

The input stage 201 includes: NMOS transistors M1 to M6, PMOS transistors M7 to M9, and resistors R1 to R5. The unit serves as the input stage of the entire clock driver circuit and amplifies the input differential clock signal. The double-ended to single-ended conversion stage 202 includes: NMOS transistors M10 to M14, and PMOS transistors M15 to M16. The unit performs double-ended to single-ended conversion of the clock signal output from the input stage, and converts the sine clock signal into a square wave clock signal. Due to the role of the branch in the 205 circuit, the clock edge slope can be increased to effectively reduce the clock jitter when converting to a single-ended signal. The output driver stage 203 includes: NMOS transistors M17 to M18, and PMOS transistors M19 to M20. These four transistors are connected into a two-stage cascaded push-pull phase inverter, which can drive a large load without sacrificing the speed of the circuit.

The input stage of the entire clock driver circuit can receive a differential wide-amplitude, high-speed clock signal. M5 to M8 (M5 and M6 are NMOS transistors, M7 and M8 are PMOS transistors) form two mutually loaded differential amplifiers, the mutually loaded differential amplifiers includes two differential amplifiers, either of the two differential amplifiers serves as the load of the other one; the amplitude range of the input stage is expanded, a large-current sinking and supplying capability is provided, and the slew rate is improved, such that large-amplitude and high-speed input clock signals can be received.

The NMOS transistor M9 provides a source current for the input stage circuit. The resistors R4 and R5, M4, and the circuit 204 together form a common mode negative feedback loop. When the positive input Ckin+ increases, the drain voltages of M5 and M7 decrease, the current in M5 increases, and the current in M7 decreases. At the same time, the negative input Ckin− decreases, the drain voltages of M6 and M8 increase, the current in M6 decreases, and the current in M8 increases. The increasing part of the current in M8 flows into M5 through the resistors R5 and R4. Finally, the current in the current sources M9 and M4 remains unchanged. The resistors R4 and R5 are connected in series to the output of the differential amplifiers to detect the output common mode voltage. The connection node of the resistors R4 and R5 is then connected to the gate of M4. If the output common mode voltage increases, the gate voltage of the NMOS transistor M4 would increases simultaneously.

At the same time, the current of the NMOS transistor M4 remains unchanged, causing the drain voltage of M4 to decrease. The source voltages of the NMOS transistors M5 and M6 decrease, and the common mode voltage of the differential amplifiers decreases. Similarly, if the output common mode voltage becomes smaller, the common mode negative feedback loop would cause the output common mode voltage to change in the opposite direction, so as to stabilize the common mode output voltage. During the common mode voltage stabilization process, a sharp change would affect the performance of the circuit. The role of the circuit 204 is to reduce the magnitude of the change in the common mode voltage.

The clock signal is amplified by the input stage and output to the double-ended to single-ended conversion stage 202. The NMOS transistors M10, M11, M12, M15 and M16 form a conventional double-ended to single-ended conversion circuit, which converts the differential sine signal into a single-ended square wave signal. The key to the circuit of the present disclosure is that a branch consisting of M13 and M14 is added. When the gate voltage of M11 decreases, the drain voltage of M11 increases, and at the same time, the gate voltages of M15, M16 and M13 connected to the drain of M11 increase, too. The increased gate voltage of M13 causes the branch to open, which increases the current of M16. At the same time, the drain output of M16 is the falling edge of the clock, and the edge slope would increase. When the gate voltage of M11 increases, the gate voltage of M13 decreases and the branch is closed, and the current in M16 changes normally.

Therefore, the slope of the falling edge in the output square wave signal of the double-ended to single-ended conversion stage 202 increases, which greatly reduces the clock jitter. In the A/D converter using the driver circuit of the present disclosure, the falling edge sampling can be selected. If the rising edge sampling must be used, a one-stage push-pull phase inverter may be added to the 203 circuit, so as to turn the output falling edge with increasing edge slope in 202 into a rising edge. The gate of M14 is connected to the enable signal EN. When the EN signal is high, this function is turned on. When the EN signal is low, the function is turned off.

The driver output stage 203 includes a multi-stage push-pull phase inverter, which improves the driver capability of the output square wave clock signal. The 203 circuit of the present disclosure is a two-stage push-pull phase inverter. In an A/D converter that requires the clock rising edge as the sampling edge, another stage of push-pull phase inverter may be added.

Figure 3:
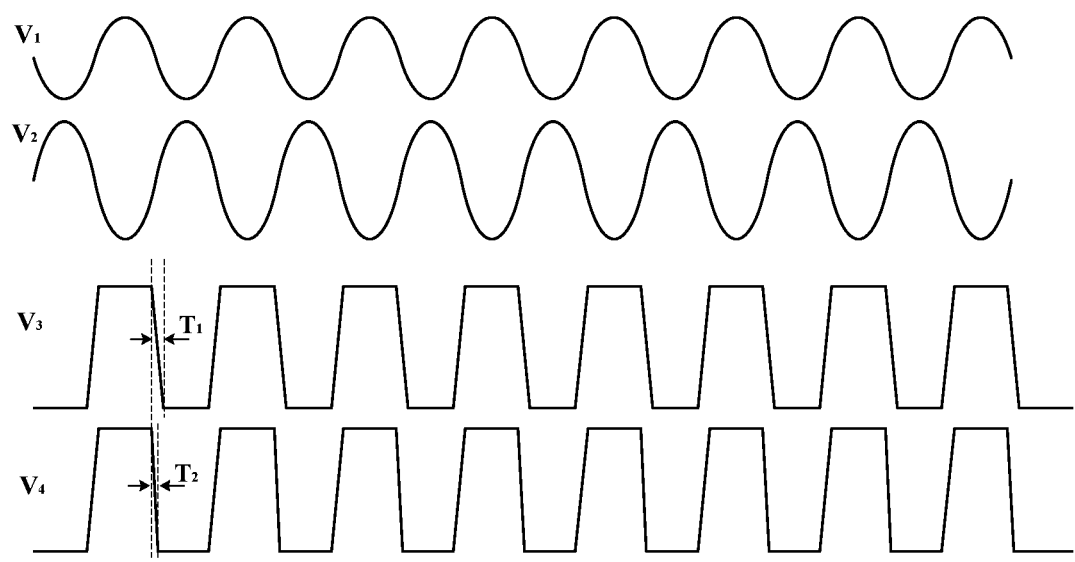
FIG. 3 shows a signal waveform diagram of a clock driver circuit using an input stage and a double-ended to single-ended conversion stage according to the present disclosure.

Referring to FIG. 3, which shows a signal waveform diagram of a clock driver circuit using an input stage and a double-ended to single-ended conversion stage according to the present disclosure. $V_1$ is a differential input sine clock signal of the input stage 201. $V_2$ is a differential output sine clock signal of the input stage 201. $V_3$ is a single-ended output square wave clock signal in the double-ended to single-ended conversion stage 202 when the enable signal EN is low. $V_4$ is a single-ended output square wave clock signal in the double-ended to single-ended conversion stage 202 when the enable signal EN is high. The falling edge time of the clock in $V_3$ is $T_1$, and the falling edge time of the clock in $V_4$ is $T_2$. When the present disclosure is implemented using a 0.18 μm CMOS process, $T_1$ is about 100 ps, and $T_2$ is about 60 ps. Compared with the conventional clock driver circuit, the double-ended to single-ended conversion stage 202 of the present disclosure can greatly reduce the falling edge time of the clock, improve the edge slope, and reduce the clock jitter generated by the driver circuit. In addition, the circuit of the present disclosure is practical and can be applied to all circuits using a 0.18 μm CMOS process. The specific size of the CMOS transistor is not the key point of the present disclosure, and would not be described in detail here.

In summary, the input stage of the present disclosure uses differential amplifiers which load each other, either of the two differential amplifiers serves as the load of the other one to expand the amplitude range of the input stage, a large-current sinking and supplying capability is provided, and the slew rate is improved, such that the clock driver circuit can receive large-amplitude and high-speed input clock signals. At the same time, a branch is provided in the double-ended to single-ended conversion circuit. During the double-ended to single-ended conversion process of the clock signal, the branch increases the current during conversion according to the signal, which can increase the slope of the clock edge and effectively reduce the clock jitter. Therefore, the present disclosure effectively overcomes various shortcomings in the traditional technology and has high industrial utilization value.

The above-described embodiments are merely illustrative of the principles of the disclosure and its effects, and are not intended to limit the disclosure. Modifications or variations of the above-described embodiments may be made by those skilled in the art without departing from the spirit and scope of the disclosure. Therefore, all equivalent modifications or changes made by those who have common knowledge in the art without departing from the spirit and technical concept disclosed by the present disclosure shall be still covered by the claims of the present disclosure.

The invention claimed is:

1. A clock driver circuit, comprising an input stage, a double-ended to single-ended conversion stage and a driver output stage connected in sequence;
   the input stage comprises two mutually loaded differential amplifiers and a common mode negative feedback loop, the differential amplifiers are connected to a differential clock signal for amplification to generate a common mode voltage, the common mode negative feedback loop is connected to an output end of the differential amplifiers to stabilize an output amplitude of the common mode voltage;
   the double-ended to single-ended conversion stage converts a differential sine clock signal output by a double-ended common mode voltage into a single-ended square wave clock signal;
   the driver output stage comprises a multi-stage cascaded push-pull phase inverter to improve driving of the square wave clock signal.

2. The clock driver circuit according to claim 1, wherein the mutually loaded differential amplifiers comprise NMOS transistors M5 and M6, and PMOS transistors M7 and M8; a positive-going input signal Ckin+ is connected to gates of the NMOS transistor M5 and the PMOS transistor M7, respectively; drains of the NMOS transistor M5 and the PMOS transistor M7 are interconnected; a negative-going input signal Ckin− is connected to gates of the NMOS transistor M6 and the PMOS transistor M8; sources of the PMOS transistors M7 and M8 are interconnected, sources of the NMOS transistors M5 and M6 are interconnected, and drains of the NMOS transistor M6 and the PMOS transistor M8 are interconnected.

3. The clock driver circuit according to claim 1, wherein the common mode negative feedback loop comprises an amplitude suppression circuit, resistors R4 and R5, and an NMOS transistor M4; the amplitude suppression circuit comprises NMOS transistors M1 to M3, and resistors R1 to R3;
   one end of the first resistor R1 is grounded, and the other end of the first resistor R1 is connected to a source of the NMOS transistor M1;
   a gate and a drain of the NMOS transistor M1 are interconnected and are respectively interconnected with a gate of M2 and a source of M3;
   a drain and a gate of the NMOS transistor M3 are interconnected and are connected to one end of the third resistor, and the other end of the third resistor is connected to a power supply voltage;
   a source of the NMOS transistor M2 is connected to one end of the second resistor R2, and the other end of the second resistor R2 is grounded; a drain of the NMOS transistor M2 is connected to one end of the fourth resistor and one end of the fifth resistor, and is connected to a gate of the NMOS transistor M4;
   a source of the NMOS transistor M4 is grounded, and the other end of the fourth resistor and the other end of the fifth resistor are correspondingly connected to a common mode voltage output by the differential amplifiers.

4. The clock driver circuit according to claim 1, wherein the input stage comprises an NMOS transistor M9, a source of the NMOS transistor M9 is connected to a power supply voltage, a gate of the NMOS transistor M9 is connected to a first bias voltage, and a drain of the NMOS transistor M9 is connected to sources of the PMOS transistors M7 and M8 of the differential amplifiers.

5. The clock driver circuit according to claim 1, wherein the double-ended to single-ended conversion stage comprises a double-ended to single-ended conversion circuit and a branch circuit; the double-ended to single-ended conversion circuit converts a differential sine clock signal into a single-ended square wave clock signal; the branch circuit adjusts a clock edge slope to reduce a clock jitter when converting the clock signal.

6. The clock driver circuit according to claim 5, wherein the double-ended to single-ended conversion circuit comprises NMOS transistors M10 to M12, and PMOS transistors M15 to M16;
   a gate of the NMOS transistor M10 is connected to a second bias voltage, a source of the NMOS transistor M10 is grounded, and a drain of the NMOS transistor M10 is respectively connected to sources of the NMOS transistors M11 and M12;
   gates of the NMOS transistors M11 and M12 are correspondingly connected to an output end of the differential amplifiers, and drains of the NMOS transistors M11 and M12 are connected to drains of the PMOS transistors M15 and M16;
   sources of the PMOS transistors M15 and M16 are connected to a power supply voltage, and gates of the PMOS transistors M15 and M16 are interconnected and connected to a drain of the PMOS transistor M15.

7. The clock driver circuit according to claim 5, wherein the branch circuit comprises NMOS transistors M13 to M14; a gate of the NMOS transistor M13 is connected to a gate of the NMOS transistor M16; a drain of the NMOS transistor M13 is connected to a source of the NMOS transistor M12; a source of the NMOS transistor M13 is connected to a drain of the NMOS transistor M14; a source of the NMOS transistor M14 is grounded, and a gate of the NMOS transistor M14 is connected to an enable signal.

8. The clock driver circuit according to claim 1, wherein the multi-stage cascaded push-pull phase inverter includes an interconnected two-stage push-pull phase inverter.

9. The clock driver circuit according to claim 8, wherein the two-stage push-pull phase inverter comprises a first-stage push-pull phase inverter and a second-stage push-pull phase inverter in cascade; the first-stage push-pull phase inverter comprises an NMOS transistor M17 and a PMOS transistor M19; the second-stage push-pull phase inverter comprises an NMOS transistor M18 and a PMOS transistor M20;
   a gate of the NMOS transistor M17 and a gate of the M19 are interconnected to access an output end of the double-ended to single-ended conversion stage;
   sources of the PMOS transistors M19 and M20 are connected to a power supply voltage;
   sources of the NMOS transistors M17 and M18 are grounded;
   drains of the NMOS transistor M17 and the PMOS transistor M19 are interconnected and connected to gates of the NMOS transistor M18 and the PMOS transistor M20;
   drains of the NMOS transistor M18 and the PMOS transistor M20 are interconnected as an output.

* * * * *